(12) United States Patent
Vadhavkar et al.

(10) Patent No.: US 9,039,474 B2
(45) Date of Patent: May 26, 2015

(54) MAGNETICALLY ADJUSTING COLOR-CONVERTING MATERIALS WITHIN A MATRIX AND ASSOCIATED DEVICES, SYSTEMS, AND METHODS

(75) Inventors: Sameer S. Vadhavkar, Boise, ID (US);
Tim J. Corbett, Boise, ID (US); Xiao Li, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 629 days.

(21) Appl. No.: 13/294,780

(22) Filed: Nov. 11, 2011

(65) Prior Publication Data
US 2013/0119419 A1    May 16, 2013

(51) Int. Cl.
*F23Q 23/08*    (2006.01)
*H01L 33/50*    (2010.01)
*H01F 1/08*    (2006.01)

(52) U.S. Cl.
CPC ............ *H01L 33/502* (2013.01); *H01L 33/504* (2013.01); *H01L 33/507* (2013.01); *H01L 2933/0041* (2013.01); *H01F 1/083* (2013.01)

(58) Field of Classification Search
CPC ... H01L 33/502; H01L 33/504; H01L 33/508; H01L 31/0232; H01F 1/083; C09K 11/80
USPC ...................................... 313/498–512; 445/3
See application file for complete search history.

(56) References Cited

U.S. PATENT DOCUMENTS

| | | | |
|---|---|---|---|
| 5,616,416 A | 4/1997 | Yamaguchi | |
| 7,576,478 B2 | 8/2009 | Hikmet | |
| 7,875,466 B2 | 1/2011 | Lu et al. | |
| 2005/0282307 A1 | 12/2005 | Daniels | |
| 2011/0025951 A1 | 2/2011 | Jones | |
| 2011/0121556 A1 | 5/2011 | Raksha et al. | |
| 2011/0140593 A1 | 6/2011 | Negley et al. | |

OTHER PUBLICATIONS

Balakrishnan, S. et al., "Synthesis and Characterisation of Optically Tunable, Magnetic Phosphors", Materials Chemistry and Physics, 120 (2010) 649-655.
Rao, R.P., Nanophosphors for Lighting to Life Sciences, presented at IEEE San Francisco Bay Area Nanotechnology Council, Jun. 15, 2010, 30 pages.

*Primary Examiner* — Andrew Coughlin
(74) *Attorney, Agent, or Firm* — Perkins Coie LLP

(57) ABSTRACT

Magnetically adjusting color-converting particles within a matrix and associated devices, systems, and methods are disclosed herein. A magnetic-adjustment process can include applying a magnetic field to a mixture including a non-solid matrix and a plurality of color-converting particles (e.g. magnetically anisotropic color-converting particles). The magnetic field can cause the plurality of color-converting particles to move into a generally non-random alignment (e.g., a generally non-random magnetic alignment and/or a generally non-random shape alignment) within the non-solid matrix. The non-solid matrix then can be solidified to form a solid matrix. A magnetic-adjustment process can be performed in conjunction with testing and/or product binning of solid-state radiation transducer devices. For example, a position, direction, strength, or duration of a magnetic field used to perform a magnetic-adjustment process can be controlled according to optical output collected from a solid-state radiation transducer device. Measuring the optical output and performing the magnetic-adjustment process can be at least partially concurrent.

35 Claims, 14 Drawing Sheets

MAGNETICALLY ADJUSTING COLOR-CONVERTING MATERIALS WITHIN A MATRIX AND ASSOCIATED DEVICES, SYSTEMS, AND METHODS

TECHNICAL FIELD

The present technology relates to color-converting materials, such as color-converting materials within a matrix. In particular, the present technology relates to magnetically adjusting color-converting materials within a matrix, components of solid-state radiation transducer devices including magnetically-adjusted color-converting materials, and associated devices, systems, and methods.

BACKGROUND

Color-converting materials (e.g., phosphor materials) absorb light at certain wavelengths and emit light at different wavelengths. Optical components including color-converting materials are used in a variety of electronic devices, including illumination devices and devices with electronic displays, such as mobile phones, digital cameras, and televisions. In many such devices, color-converting materials are used in conjunction with solid-state radiation transducers ("SSRTs"). Examples of SSRTs include light-emitting diodes, organic light-emitting diodes, and polymer light-emitting diodes. In a common application, a color-converting material is used to modify the light output from an SSRT to include additional or different wavelengths. SSRTs typically emit light having a narrow range of wavelengths. Color-converting materials can absorb some or all of the emitted light from an SSRT and convert it into light having a different range of wavelengths. For example, some SSRT devices include an SSRT that emits blue light and a color-converting material that absorbs some of the blue light and converts it into yellow light. The combination of blue light from the SSRT and yellow light from the color-converting material can appear white. Known color-converting materials useful for this purpose include yttrium aluminum garnet ("YAG") doped with various rare earth elements, such as cerium.

Optical components of SSRT devices can include particles of color-converting material within a matrix. Selecting the type of color-converting material and the size and concentration of the particles of color-converting material within the matrix can allow for significant control over the performance characteristics of the optical component. Optical components manufactured according to the same specifications, however, can have somewhat different performance characteristics. Other components of SSRT devices, such as the SSRTs themselves, also typically exhibit variable performance characteristics despite like manufacturing. Additionally, different SSRTs manufactured on the same wafer can have different performance characteristics. Certain applications require SSRT devices having performance characteristics falling within a specified range. Correlated color temperature ("CCT") and lumen output are examples of performance characteristics commonly specified for SSRT devices. Product binning, which typically includes testing SSRT devices after manufacturing and separating the SSRT devices according to the test results, can be used to ensure that SSRT devices sold to customers meet specified requirements.

SSRT devices from the same manufacturing process can have significantly different market values depending on performance. Customers of SSRT devices often specify both non-performance characteristics (e.g., size) and performance characteristics (e.g., CCT). Non-performance characteristics can be easier to control during manufacturing than performance characteristics. Accordingly, it is typical for only some SSRT devices manufactured according to specified non-performance characteristics to also meet corresponding performance characteristics. SSRT devices not meeting specified performance characteristics can be discarded or sold at a substantial discount for use in other applications, such as low-end applications. The percentage of SSRT devices from a manufacturing process meeting specified performance characteristics can significantly affect the profitability of the manufacturing process. Accordingly, there is a need for innovation related to performance characteristics of SSRT devices and components of SSRT devices, such as to improve the percentage of SSRT devices from a manufacturing process meeting specified performance characteristics.

BRIEF DESCRIPTION OF THE DRAWINGS

Many aspects of the present disclosure can be better understood with reference to the following drawings. The components in the drawings are not necessarily to scale. Instead, emphasis is placed on illustrating clearly the principles of the present disclosure. In the drawings, like reference numerals designate corresponding parts throughout the several views.

DETAILED DESCRIPTION

Figure 1:
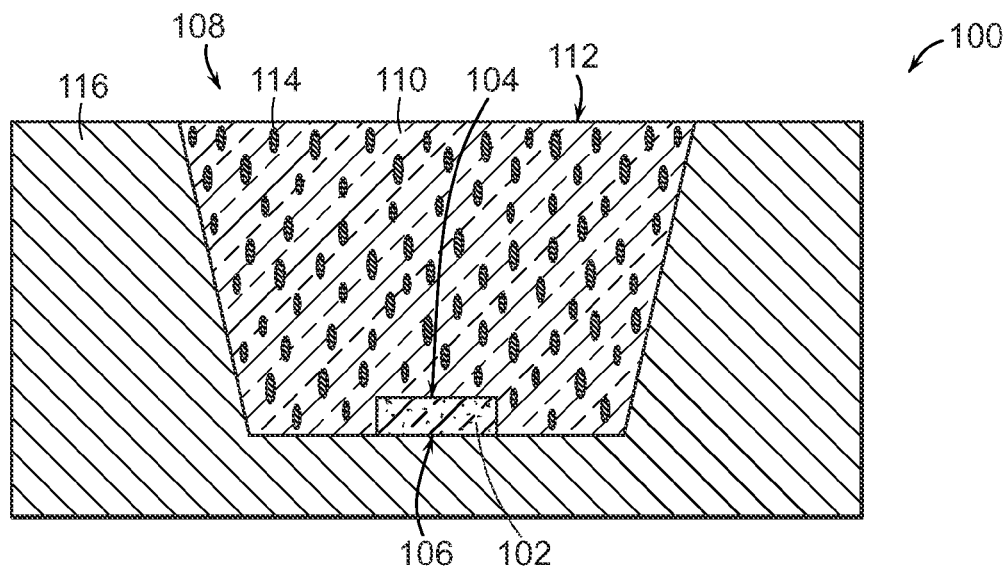
FIG. 1 is a partially schematic cross-sectional diagram of an SSRT device configured in accordance with an embodiment of the present technology device and having color-converting particles in a first generally non-random alignment.

The present technology is directed to devices, systems, and methods related to color-converting materials (e.g., particles) within a matrix. Embodiments of the present technology can include adjusting the orientation or position of color-converting particles within a matrix of an optical component of a device (e.g., an SSRT device). It is expected that adjusting the orientation or position of color-converting particles may affect the performance characteristics of the optical component and/or the device. For example, adjusting the orientation or position of color-converting particles may change the ratio of converted light to total light exiting a device, such as by causing the color-converting particles to occupy more or fewer optical exit paths from a light source (e.g., an SSRT) within the device to an exterior of the device. If more or less light from a light source contacts color-converting particles, the ratio of converted light to total light exiting a device is likely to increase or decease, respectively. This ratio, for example, can affect correlated color temperature ("CCT"), which can be an important performance characteristic in product binning.

It is also expected that adjusting the orientation or position of color-converting particles within a matrix of an optical component of a device may change the efficiency of the optical component and/or the device. Color-converting particles typically emit light in all directions. As a result, light can be emitted from color-converting particles in directions that do not lead out of a device. Such light can contact other color-converting particles, a surface of a light source, or another reflective or non-reflective surface within a device. As a result of this scattering effect, some energy of the light is lost as heat. Even surfaces designed to be reflective typically absorb some light energy as heat. When color-converting particles occupy more or fewer optical exit paths from a light source to an exterior of a device, the efficiency of the device is likely to be lower or higher, respectively. Efficiency, for example, can affect the lumen output of a device, which, like CCT, can be an important performance characteristic in product binning.

Adjusting the orientation or position of color-converting particles within a matrix of an optical component of a device can be useful to improve (e.g., optimize) the optical component or to cause the optical component to at least partially compensate for variable performance characteristics of an associated component, such as an associated light source. For example, SSRTs from a single manufacturing process may emit light at somewhat different wavelengths or intensities relative to each other or to a target range. Ordinarily, this may cause SSRT devices to fail to qualify for desirable binning based on CCT, lumen output, or another performance characteristic. Embodiments of the present technology are expected to allow the amount of color conversion within SSRT devices to be changed so that more (e.g., generally all) SSRT devices from a manufacturing process qualify for desirable binning.

CCT and lumen output are characteristics of the overall spectral power distribution of a device. The characteristics of unconverted light from a light source and converted light from a color-converting material differ, so their relative amounts in a device's output can affect the CCT or lumen output of the device. In addition, when a device includes more than one type of color-converting material, the relative amounts of unconverted light from a light source and converted light from each type of color-converting material in the device's output can affect the CCT or lumen output of the device. For example, if an SSRT emits light at a lower range of wavelengths than a target range of wavelengths, an amount of light from an associated color-converting material emitting light at a higher range of wavelengths than the SSRT can be increased to potentially cause the CCT of the SSRT device to change from a less desirable lower value to a more desirable higher value. Similarly, if an SSRT emits light at a lower intensity than a target intensity, the amount of light from an associated color-converting material can be decreased to potentially cause the lumen output of the SSRT device to change from a less desirable lower value to a more desirable higher value. In a similar manner, CCT, lumen output, or another performance characteristic of a device can be increased or decreased, such as to affect product binning.

Embodiments of the present technology include applying a magnetic field to color-converting particles within a matrix in a non-solid form to adjust the orientation or position of the color-converting particles. A magnetic-adjustment process can be performed on any suitable number of color-converting particles, such as two, ten, 100, or a greater number of color-converting particles. After or during a magnetic-adjustment process, the solidity of the matrix can be increased (e.g., the matrix can be solidified into a solid form) so that the matrix retains the color-converting particles in their adjusted orientations or positions. In its non-solid form, the matrix can have a viscosity, for example, characteristic of a liquid or a gel, such as a viscosity sufficient to prevent significant settling of the color-converting particles for 30 minutes, one hour, or another suitable time period. In embodiments of the present technology, the matrix can be generally optically transparent. Suitable matrix materials for use in embodiments of the present technology include transparent epoxies, silicones, polyimides, acrylics, and other suitable thermoplastic and thermosetting materials, among others. Increasing the solidity of the matrix can include any suitable process for increasing the solidity (e.g., curing) a matrix material within the matrix, such as heating in an oven, applying infrared radiation, applying microwave radiation, applying ultraviolet radiation (e.g., at a selected temperature), or simply allowing the matrix material to chemically solidify over time.

Color-converting particles configured in accordance with embodiments of the present technology can include a variety of color-converting materials, such as quantum dots and/or phosphor materials that exhibit luminescence. The color-converting particles can be solid masses of a color-converting material or can include a color-converting material in combination with one or more non-color-converting materials. When a color-converting particle includes a non-color-converting material, the color-converting material can be coated on the non-color-converting material, positioned within the non-color-converting material (e.g., dispersed within the non-color-converting material), homogenously mixed with the non-color-converting material, heterogeneously mixed with the non-color-converting material, or otherwise integrated with the non-color-converting material. In embodiments of the present technology, a color-converting material in a color-converting particle can be a doped garnet, such as a doped YAG. For example, the color-converting material can be cerium(III)-doped YAG, neodymium-doped YAG, neodymium-chromium double-doped YAG, erbium-doped YAG, ytterbium-doped YAG, neodymium-cerium double-doped YAG, holmium-chromium-thulium triple-doped YAG, thulium-doped YAG, chromium(IV)-doped YAG, dysprosium-doped YAG, samarium-doped YAG, or terbium-doped YAG. Suitable color-converting materials for use in embodiments of the present technology can have an emission peak of from about 500 nm to about 700 nm, e.g., from about 520 nm to about 580 nm. Some color-converting particles suitable for use with embodiments of the present technology are available, for example, from SRI International (Menlo Park, Calif.). Suitable processes for forming the color-converting particles can include, without limitation, solid state reaction, sol-gel processes (e.g., aerogel and xerogel processes), co-precipitation, solution processes, spray pyrolysis, spray flame pyrolysis, laser pyrolysis, chemical vapor synthesis, emulsion liquid membrane processes, hydrothermal processes, and combustion processes.

In embodiments of the present technology, some, most, or generally all color-converting particles within a matrix can be magnetic (e.g., ferromagnetic). For example, the color-converting particles can include a magnetic material that is also a color-converting material or a magnetic material that is not also a color-converting material. Magnetic materials suitable for combination with color-converting materials can include, for example, iron, cobalt, nickel, manganese, gadolinium, dysprosium, europium, chromium, or a combination thereof. Although magnetic materials having a variety of optical properties can be useful in embodiments of the present technology, magnetic materials that are generally transparent or highly reflective can be particularly useful. Many magnetic materials are opaque to most light and are poorly reflective, which can be detrimental to the efficiency of an optical component. Some magnetic materials, however, are generally transparent in bulk and/or in nanoparticle form. For example, some magnetic materials can be opaque to most light and poorly reflective in bulk and generally transparent in nanoparticle form. In embodiments of the present technology, color-converting particles include, without limitation, a generally transparent magnetic material, such as a generally transparent form of iron oxide. In addition or instead, the color-converting particles can include a magnetic material that is highly reflective, e.g., a material having a percentage reflectance greater than about 90% at a wavelength of about 550 nm.

Color-converting particles configured in accordance with embodiments of the present technology can be or can include components that are physically or chemically modified to be magnetic. For example, a particle of a color-converting material can be connected to a particle of a magnetic material to form a color-converting particle. Iron oxide, lanthanum calcium manganate, nickel oxide, europium oxide, europium sulfide, and chromium bromide are examples of magnetic materials that can be deposited on a color-converting material using a conventional semiconductor deposition process. Such a deposition process can occur before or after milling the color-converting material into particles. In embodiments of the present technology, a color-converting particle or a component of a color-converting particle can be chemically functionalized with a magnetic functional group. For example, a color-converting material with hydroxyl groups or adsorbed water on its surface can be encapsulated with silica using the Stöber method. The resulting structure can be co-precipitated from a solution of iron salts (e.g., divalent and/or trivalent iron salts) to functionalize surfaces of the structure with magnetite. This process is suitable to functionalize a variety of color-converting materials, such as doped yttrium vanadate.

Figure 2:
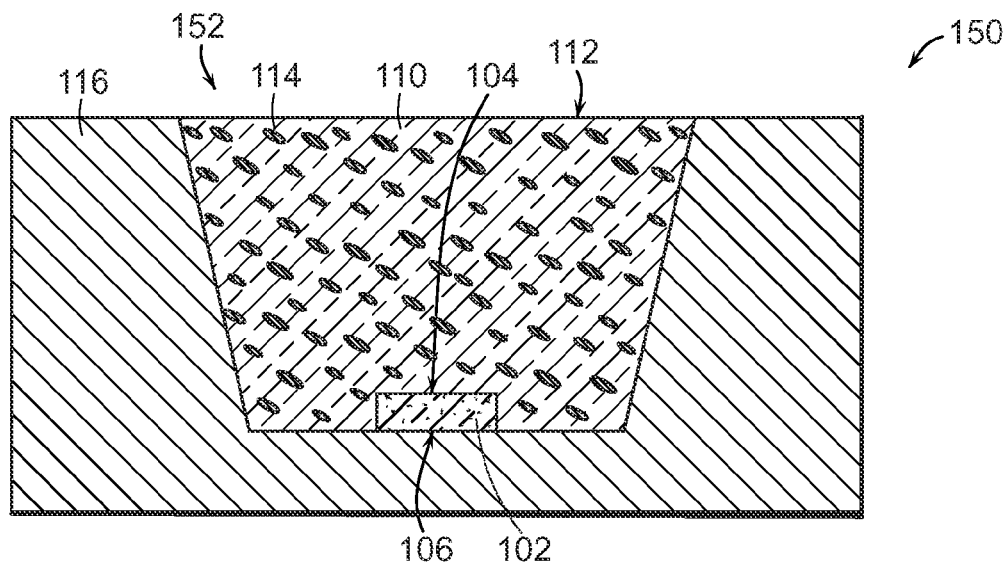
FIG. 2 is a partially schematic cross-sectional diagram of an SSRT device configured in accordance with an embodiment of the present technology and having color-converting particles in a second generally non-random alignment.

FIG. 1 illustrates an SSRT device 100 according to an embodiment of the present technology. The SSRT device 100 includes an SSRT 102 having an active side 104 and a back side 106. An optical component 108 over the SSRT 102 includes a matrix 110 with an exterior surface 112 and color-converting particles 114 within the matrix. Both the SSRT 102 and the optical component 108 are positioned within a trench of a heat sink 116. In FIG. 1, the color-converting particles 114 are generally non-randomly magnetically and shape aligned with their lengths generally perpendicular to the active side 104 of the SSRT 102. FIG. 2 illustrates an SSRT device 150 similar to the SSRT device 100 shown in FIG. 1, but with an optical component 152 different than the optical component 108 shown in FIG. 1. The color-converting particles 114 shown in FIGS. 1 and 2 have different generally non-random alignments. In FIG. 2, the color-converting particles 114 are generally non-randomly magnetically and shape aligned with their lengths angled about 30° relative to the active side 104 of the SSRT 102. Due to their different generally non-random alignments, the color-converting particles 114 shown in FIG. 2 occupy more optical exit paths than the color-converting particles shown in FIG. 1. Accordingly, it is expected that the ratio of converted light to total light exiting the SSRT device 150 shown in FIG. 2 will be higher than the ratio of converted light to total light exiting the SSRT device 100 shown in FIG. 1.

Figure 3A:
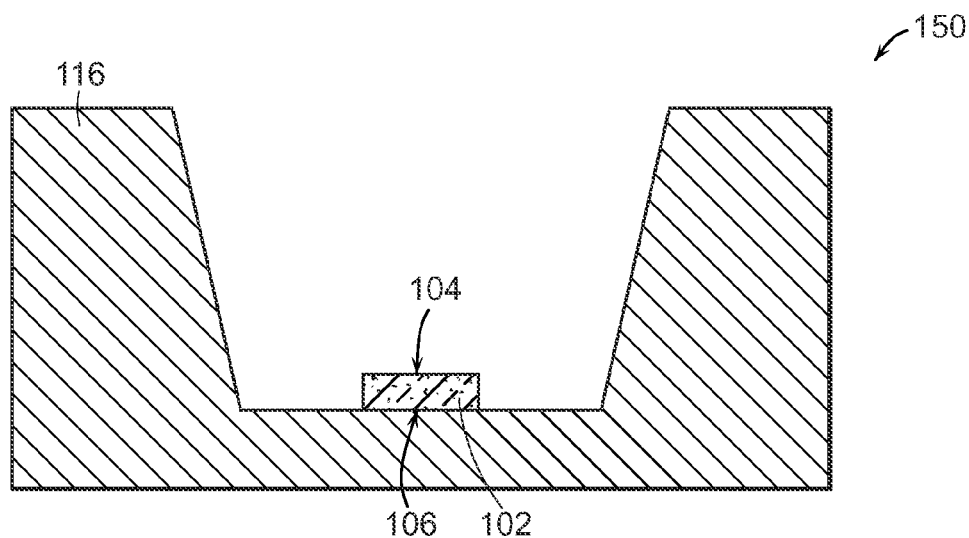
FIGS. 3A-3C are partially schematic cross-sectional diagrams illustrating a method of forming the SSRT device shown in FIG. 2.
Figure 3B:
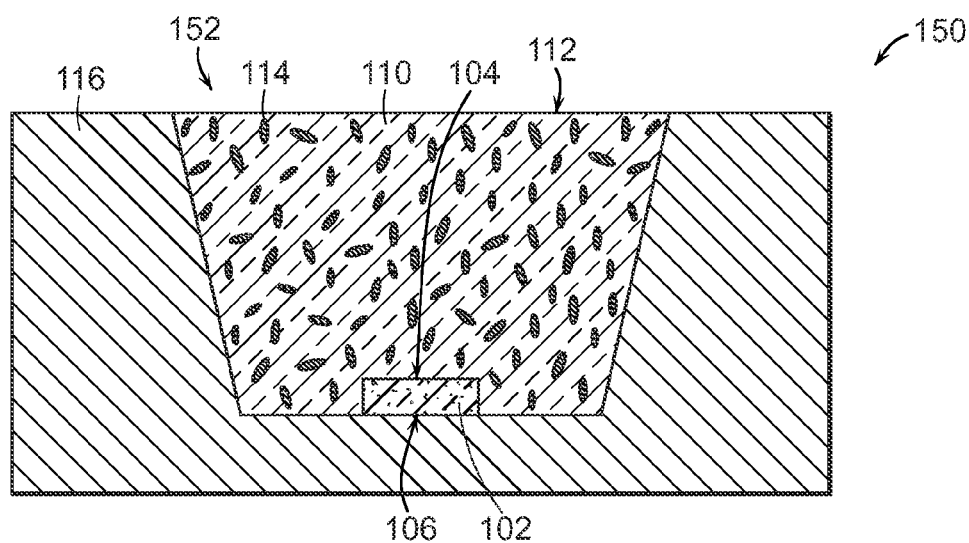
Figure 3C:
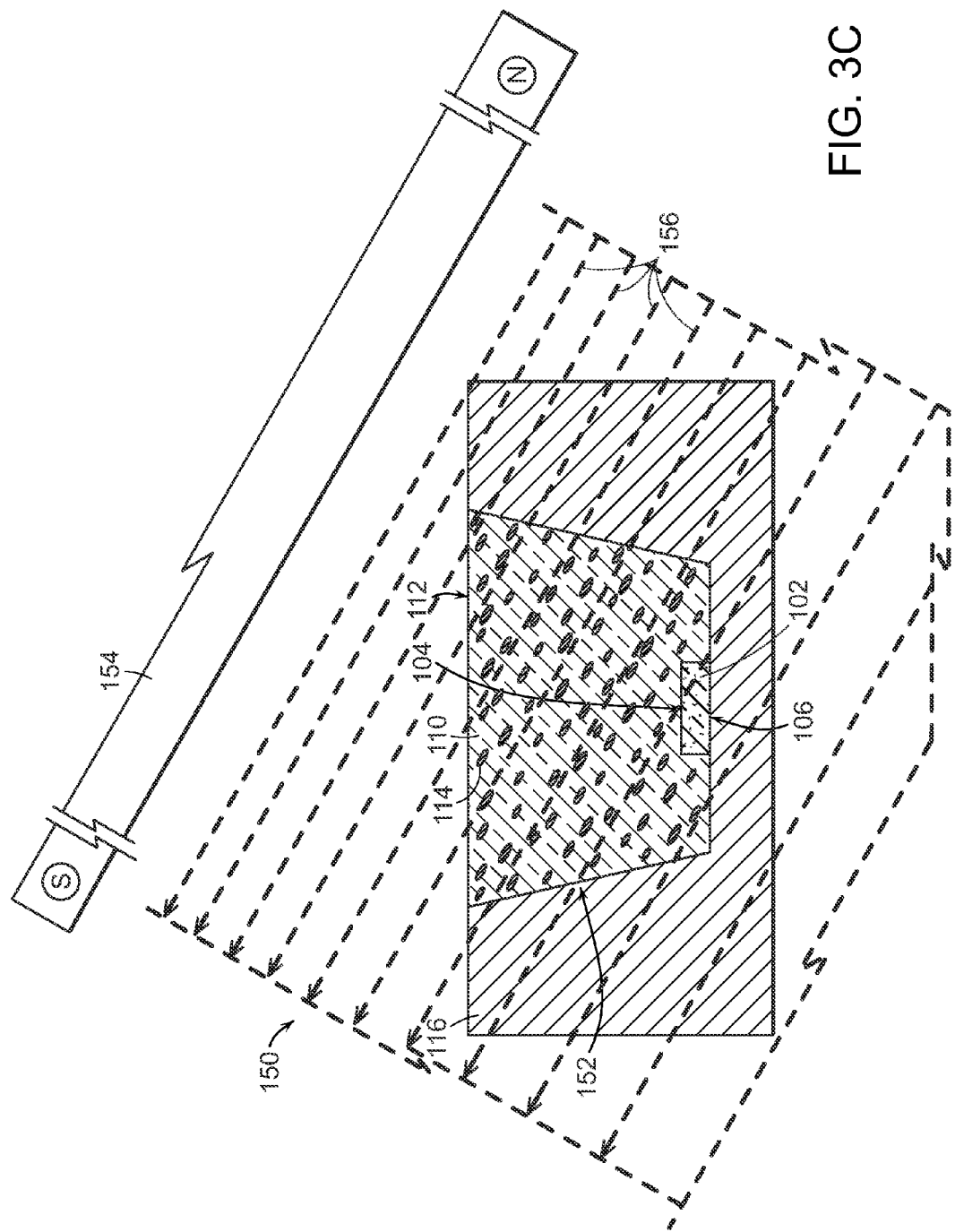

FIGS. 3A-3C illustrate a method for making the SSRT device 150 shown in FIG. 2 according to an embodiment of the present technology. As shown in FIG. 3A, the SSRT device 150 initially includes an SSRT 102 positioned within a trench of a heat sink 116. FIG. 3B illustrates a step in the method after the optical component 152 is deposited on the SSRT 102 within the trench of the heat sink 116. At the fabrication stage shown in FIG. 3B, the optical component 152 is not solid. For example, the matrix 110 of the optical component 152 can include an uncured matrix material (e.g., an uncured silicone or epoxy). The color-converting particles 114 have generally random orientations and are suspended at generally random positions within the matrix 110. As shown in FIG. 3C, a magnet 154 is positioned near the SSRT device 150. The proximity of the magnet 154 to the SSRT device 150 causes a generally H-type magnetic field represented by magnetic field lines 156 to extend through the matrix 110, which causes the color-converting particles 114 to become generally non-randomly magnetically and shape aligned. The matrix 110 then can be solidified and the magnet 154 removed. Once the matrix 110 is solidified, the color-converting particles 114 can retain their generally non-random magnetic and shape alignments. As discussed in further detail below, the degree of magnetic and/or shape alignment can be controlled to improve product binning, e.g., based on a performance characteristic measured while the magnetic field is applied.

Figure 4:
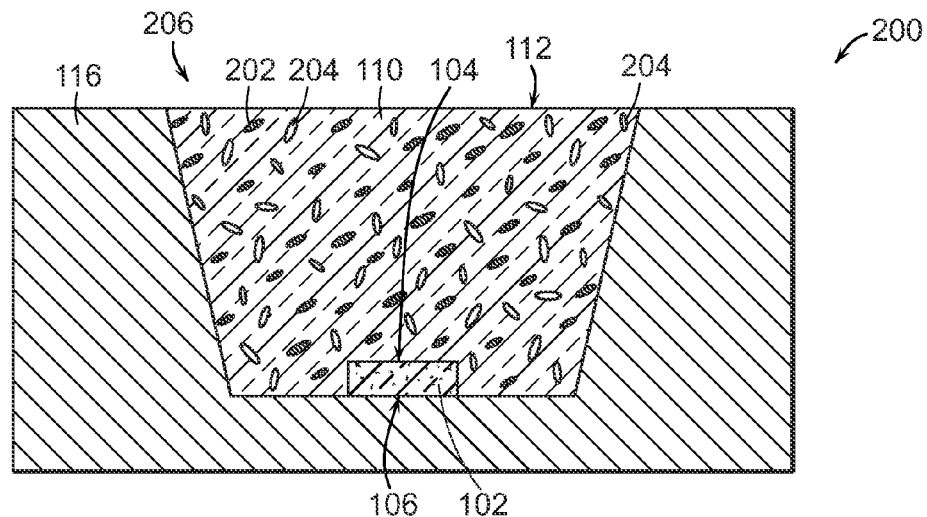
FIG. 4 is a partially schematic cross-sectional diagram of an SSRT device configured in accordance with an embodiment of the present technology and having both magnetic and non-magnetic color-converting particles.

Optical components configured in accordance with the present technology can include more than one type of color-converting particle. FIG. 4 illustrates an SSRT device 200 similar to the SSRT device 100 shown in FIG. 1, but including first color-converting particles 202 and second color-converting particles 204 in an optical component 206. The first color-converting particles 202 are magnetic and the second color-converting particles 204 are non-magnetic. The first color-converting particles 202 are generally non-randomly magnetically and shape aligned, while the second color-converting particles 204 are generally randomly oriented. The method shown in FIGS. 3A-3C can be used, for example, to selectively adjust the orientations of the first color-converting particles 202 while the second color-converting particles 204 remain generally randomly oriented. Optical components configured in accordance with embodiments of the present technology can include any suitable number of types of color-converting particles. Different size distributions, color-converting materials, non-color-converting materials, configurations, shape distributions, or other characteristics can differentiate color-converting particles of different types. In embodiments of the present technology, different types of color-converting particles within an optical component can have different magnetic properties and can be subjected to different types or degrees of magnetic adjustment. For example, a first type of color-converting particles can be more magnetic than a second type of color-converting particles. Color-converting particles of the first type can be adjusted into full generally non-random magnetic and/or shape alignments, while color-converting particles of the second type can be adjusted into partial generally non-random magnetic and/or shape alignments. This can be useful, for example, to change the ratio of color conversion by the color-converting particles of the first type to color conversion by the color-converting particles of the second type.

Figure 5:
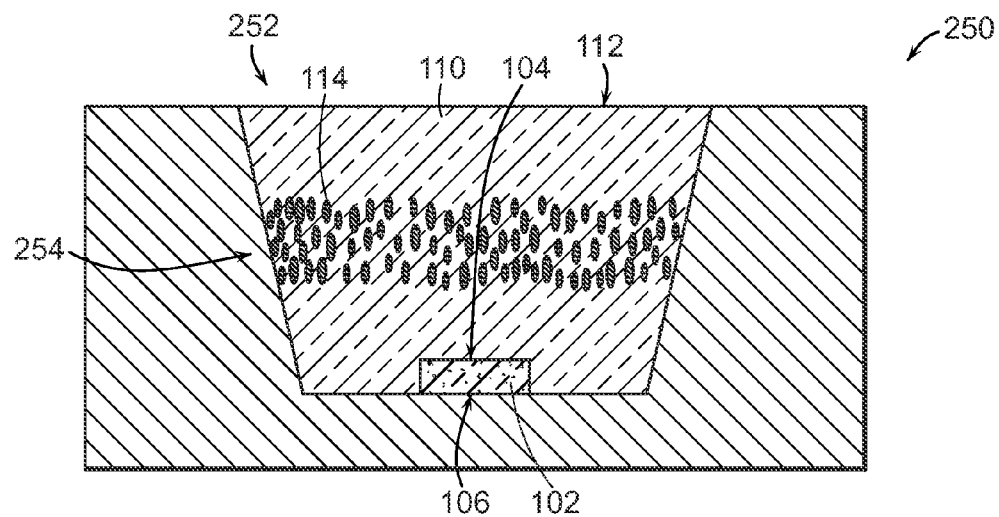
FIG. 5 is a partially schematic cross-sectional diagram of an SSRT device configured in accordance with an embodiment of the present technology and having a layer of color-converting particles.
Figure 6A:
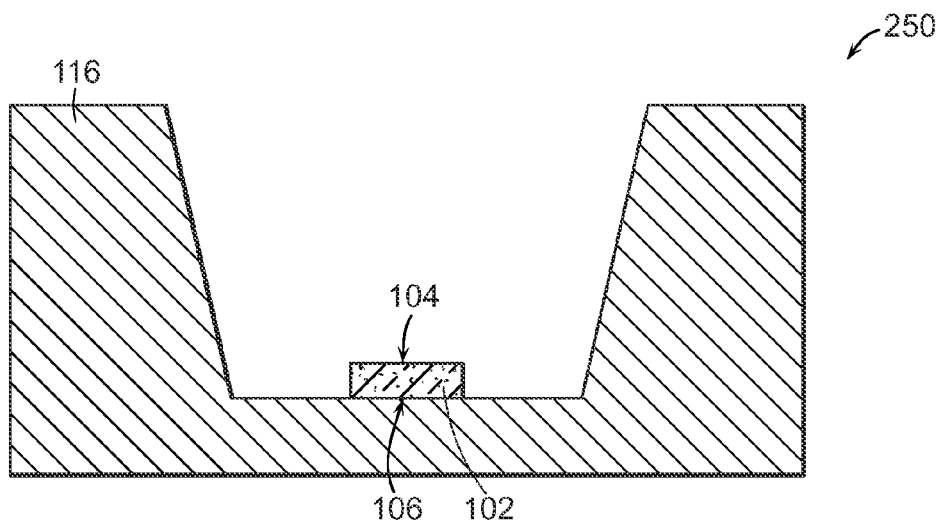
FIGS. 6A-6D are partially schematic cross-sectional diagrams illustrating a method of forming the SSRT device shown in FIG. 5.
Figure 6B:
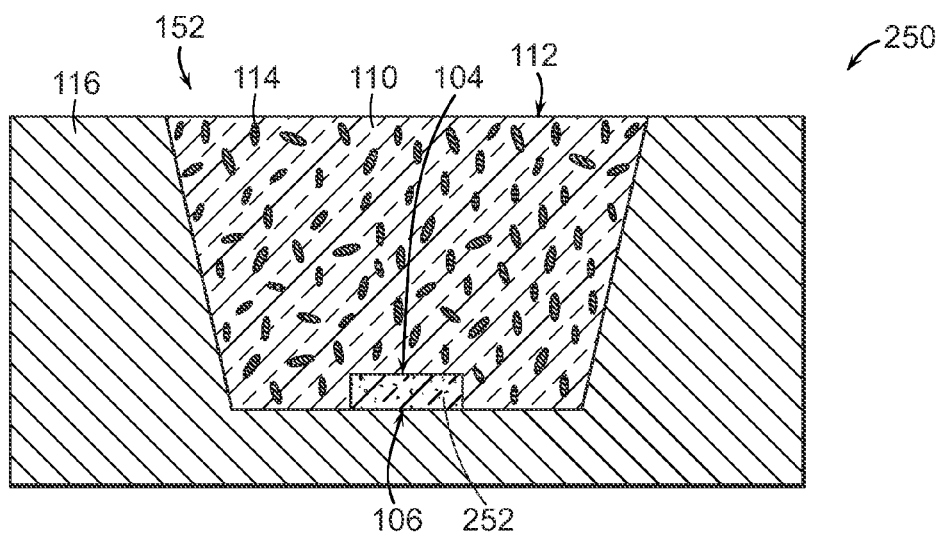

Optical components configured in accordance with embodiments of the present technology can include color-converting particles that are not evenly distributed within a matrix. For example, FIG. 5 illustrates an SSRT device 250 with an optical component 252 having a layer 254 of color-converting particles 114. FIGS. 6A-6D illustrate a method for making the SSRT device 250 shown in FIG. 5 according to an embodiment of the present technology. The method includes adjusting the position as well as the orientation of the color-converting particles 114. As shown in FIG. 6A, the SSRT device 250 initially includes an SSRT 102 positioned within a trench of a heat sink 116. FIG. 6B illustrates a step in the method after the optical component 252 is deposited on the SSRT 102 within the trench of the heat sink 116. Similar to the stage shown in FIG. 3B, at the stage shown in FIG. 6B, the optical component 252 is not solid and the color-converting particles 114 have generally random orientations and are suspended at generally random positions within a matrix 110.

Figure 6C:
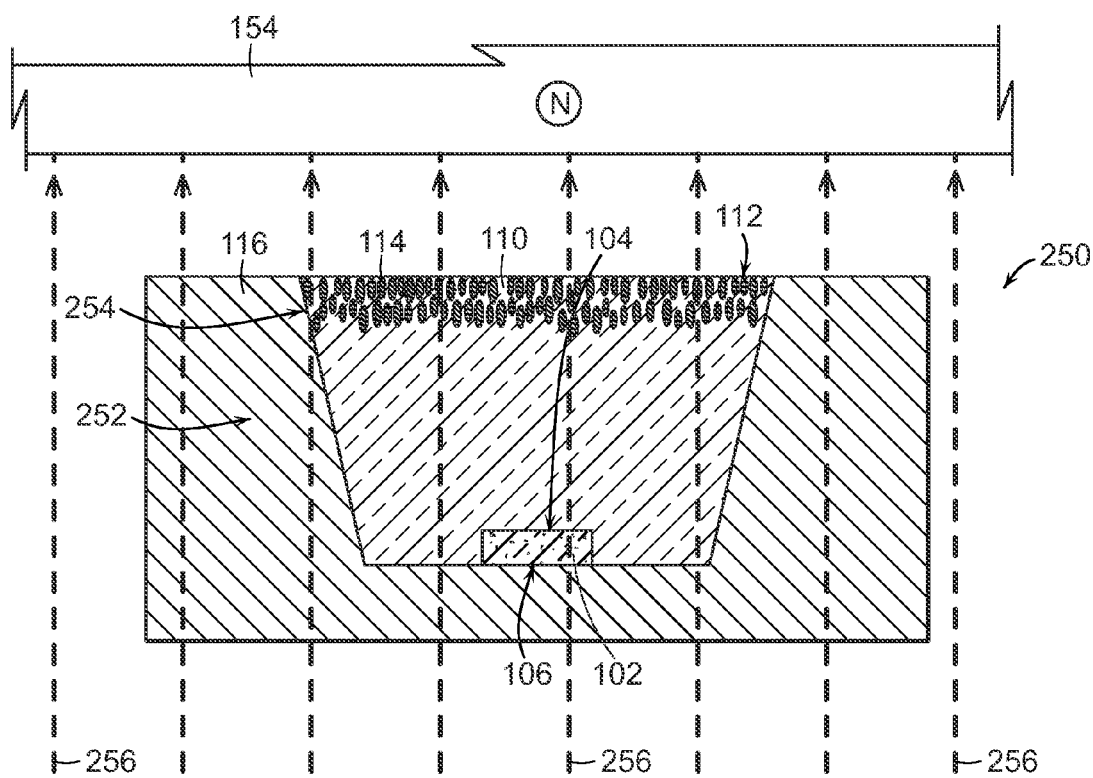
Figure 6D:
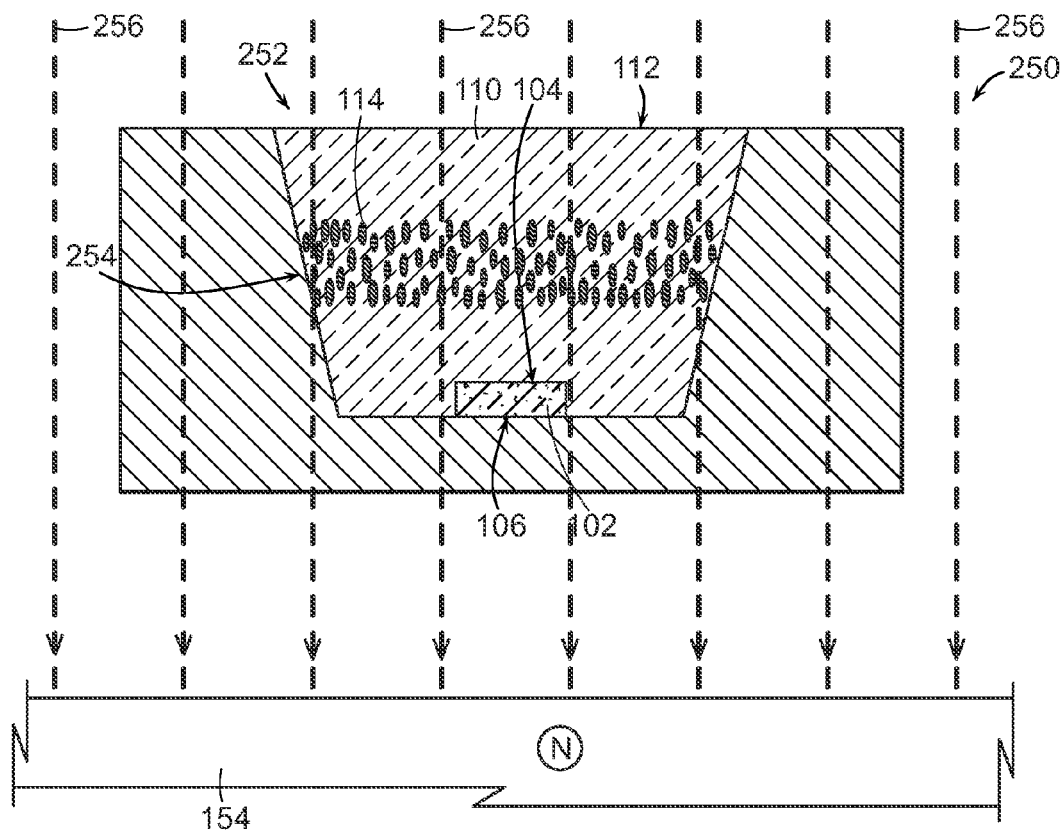

As shown in FIG. 6C, the magnet 154 is positioned near the SSRT device 250 at a different angle and magnetic orientation than shown in FIG. 3C. The proximity of the magnet 154 to the SSRT device 250 causes a generally B-type magnetic field represented by magnetic field lines 256 to extend through the matrix 110, which causes the color-converting particles 114 to become generally non-randomly magnetically and shape aligned. As will be understood by those of ordinary skill in the art, other types of magnetic fields can be applied to adjust the color-converting particles 114 as required. The magnetic field also causes the color-converting particles 114 to move into different positions within the matrix 110. In particular, the color-converting particles 114 are shown clustered into the layer 254 near the exterior surface 112 of the optical component 252. In embodiments of the present technology a barrier (not shown) can be temporarily or permanently placed over the exterior surface 112 of the optical component 252 to prevent the color-converting particles 114 from being pulled out of the matrix 110. As shown in FIG. 6D, the magnet 154 is then moved near an opposite side of the SSRT device 250. The proximity of the magnet 154 to the SSRT device 250 causes the generally B-type magnetic field represented by magnetic field lines 256 to extend through the matrix 110, which causes the layer 254 to move away from the exterior surface 112 of the optical component 252. The matrix 110 then can be solidified and the magnet 154 removed. Alternatively, the matrix 110 can be partially or fully solidified before the magnet 154 is removed (e.g., during a magnetic adjustment process). Once the matrix 110 is solidified, the color-converting particles 114 can retain their generally non-random magnetic and shape alignments as well as their positioning within the layer 254. Positioning the color-converting particles 114 in the layer 254 can be useful, for example, to distance the color-converting particles from the SSRT 102 so as to reduce heating of the color-converting particles when the SSRT is active.

Figure 7:
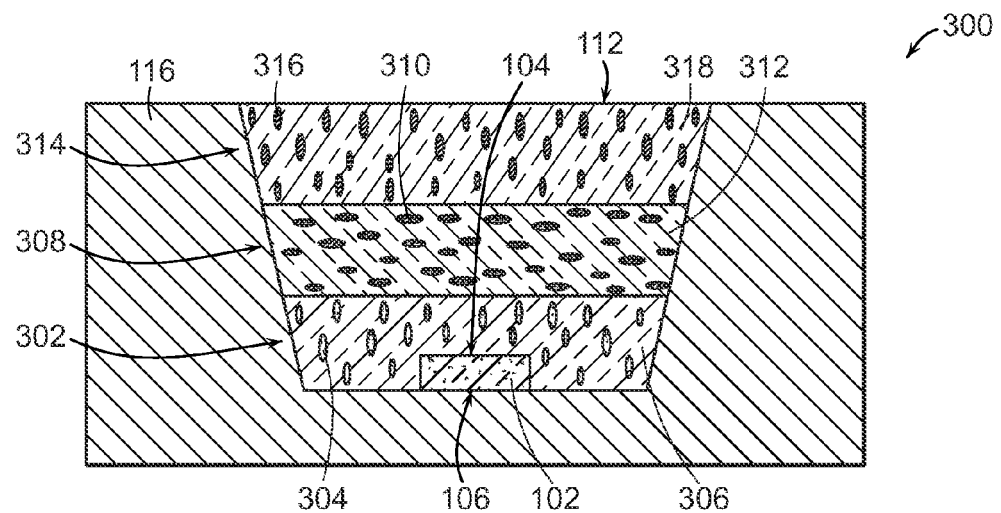
FIG. 7 is a partially schematic cross-sectional diagram of an SSRT device configured in accordance with an embodiment of the present technology and having three optical components individually having a different type of color-converting particle.

In FIGS. 1-6D, the SSRT devices 100, 150, 200, 250 each include only one optical component 108, 152, 202, 252. SSRT devices configured in accordance with embodiments of the present technology can include more than one optical component, such as multiple optical components including the same or different types of color-converting particles. For example, FIG. 7 illustrates an SSRT device 300 including a first optical component 302 having first color-converting particles 304 within a first matrix 306, a second optical component 308 having second color-converting particles 310 within a second matrix 312, and a third optical component 314 having third color-converting particles 316 within a third matrix 318. Other embodiments configured according to the present technology can include any suitable number of optical components and/or types of color-converting particles. For example, a device configured in accordance with the present technology can include one, two, three, four, five, or a greater number of optical components individually having one, two, three, four, five, or a greater number of types of color-converting particles.

Embodiments of the present technology can include selectively adjusting the orientation or position of different types of color-converting particles in different optical components. In the SSRT device 300 shown in FIG. 7, the first and third color-converting particles 304, 316 are generally non-randomly magnetically and shape aligned with their lengths generally perpendicular to the active side 104 of the SSRT 102 and the second color-converting particles 310 are generally non-randomly magnetically and shape aligned with their lengths generally parallel to the active side of the SSRT. It is expected that the ratio of light from the second color-converting particles 310 to total light from the SSRT device 300 will be greater than it would be if the first, second, and third color-converting particles 304, 310, 316 all had similar alignments, such as similar generally non-random magnetic and shape alignments. Different magnetic and/or shape alignments of color-converting particles of different types within a device can correspond to different relative amounts of color conversion by the color-converting particles of different types. Changing these ratios can be useful, for example, to cause a device to more closely match a desired spectral power distribution.

Figure 8A:
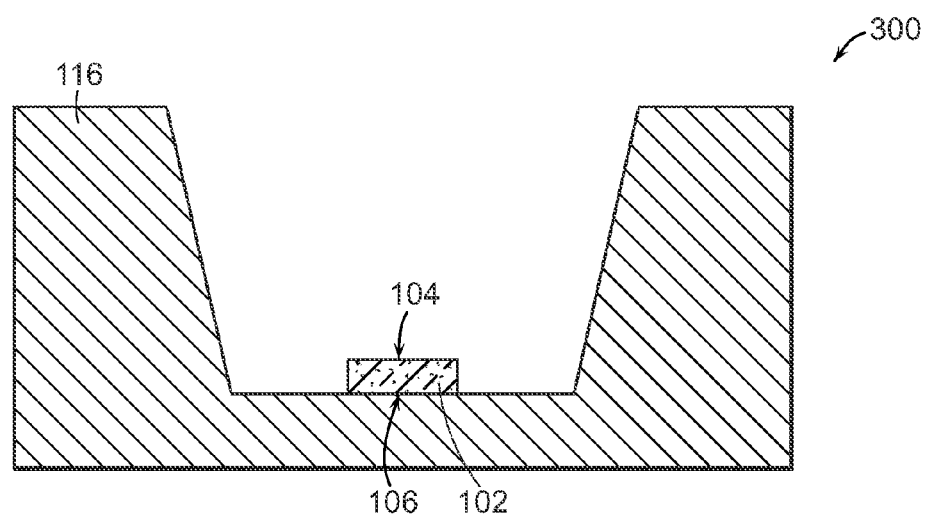
FIGS. 8A-8G are partially schematic cross-sectional diagrams illustrating a method of forming the SSRT device shown in FIG. 7.
Figure 8B:
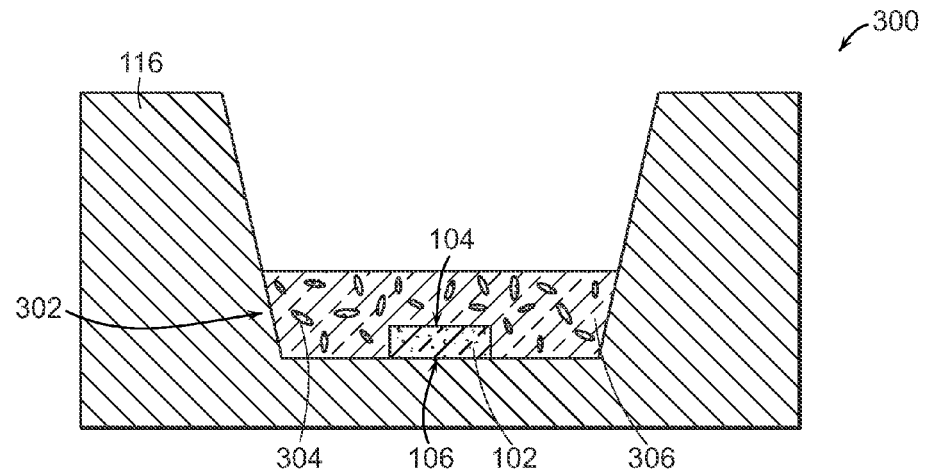
Figure 8C:
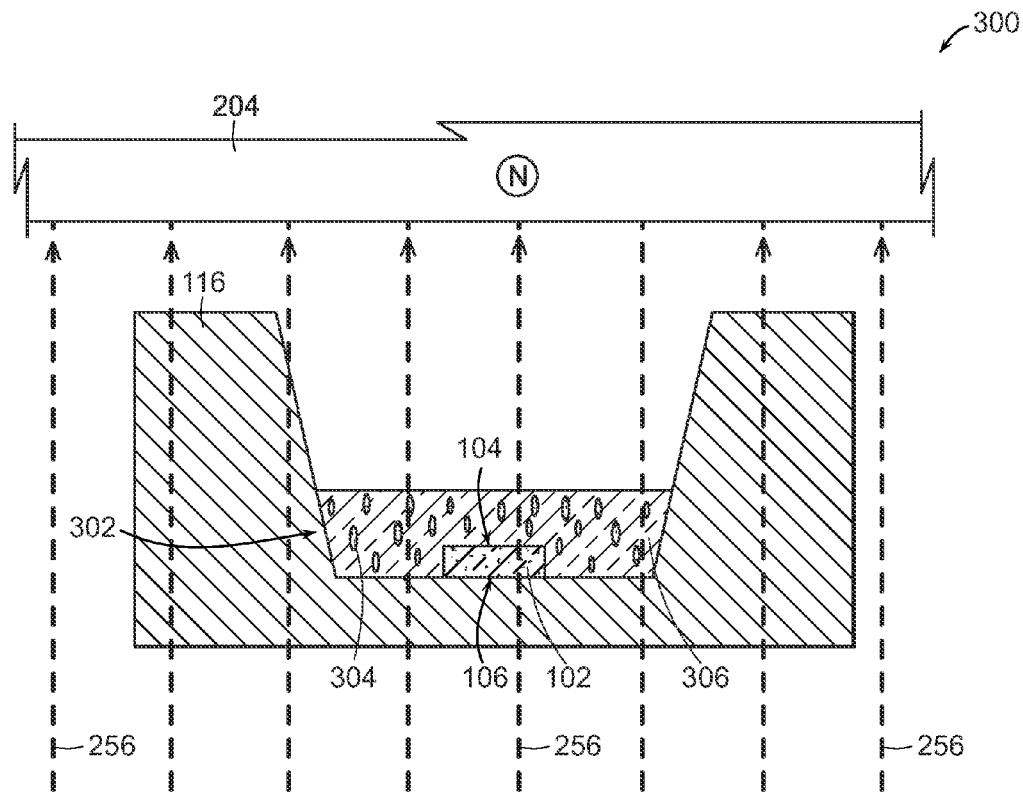

FIGS. 8A-8J illustrate a method for making the SSRT device 300 shown in FIG. 7 according to an embodiment of the present technology. As shown in FIG. 8A, the SSRT device 300 initially includes an SSRT 102 positioned within a trench of a heat sink 116. FIG. 8B illustrates a step in the method after the first optical component 302 is deposited on the SSRT 102 within the trench of the heat sink 116. The first optical component 302 is not solid at the stage shown in FIG. 8B and includes the first color-converting particles 304 having generally random orientations and suspended at generally random positions within the first matrix 306. As shown in FIG. 8C, the magnet 154 is positioned near the SSRT device 300. The proximity of the magnet 154 to the SSRT device 300 causes a generally B-type magnetic field represented by magnetic field lines 258 to extend through the first matrix 306, which causes the first color-converting particles 304 to become generally non-randomly magnetically and shape aligned. The magnet 204 is then removed and the first matrix 306 is partially or completely solidified.

Figure 8D:
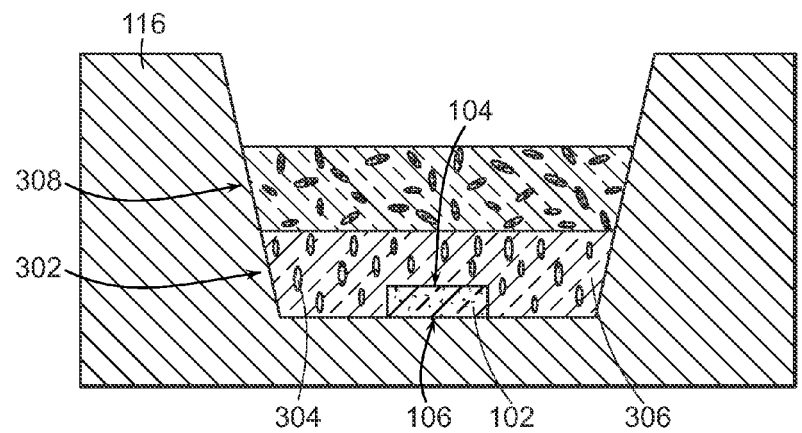
Figure 8E:
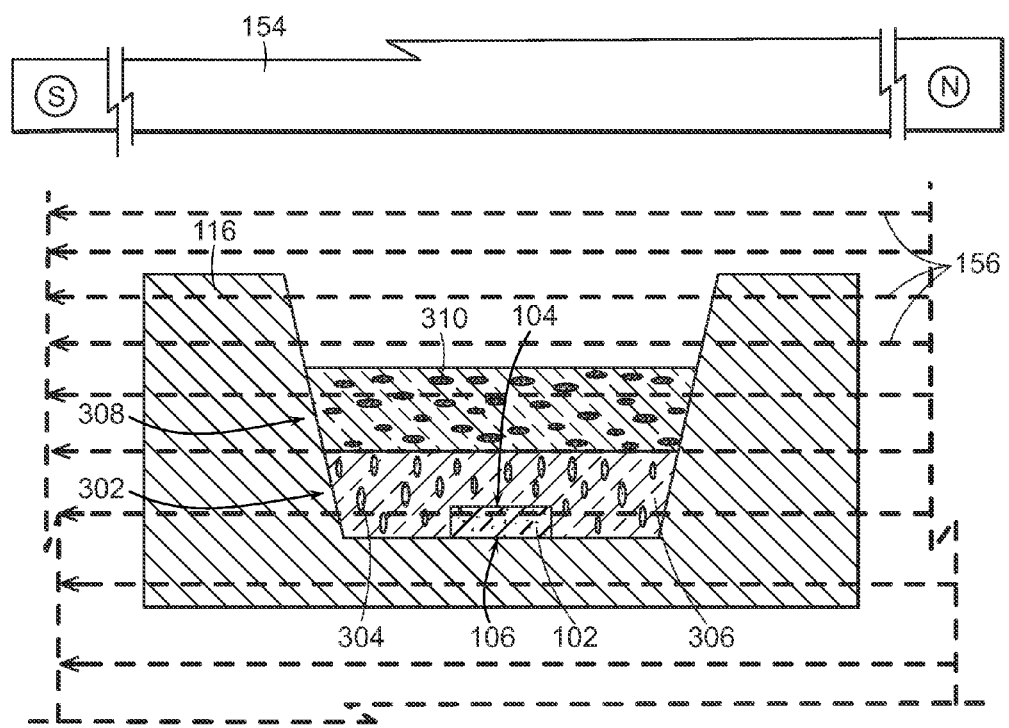

FIG. 8D illustrates a step in the method after the second optical component 308 is deposited over the first optical component 302 within the trench of the heat sink 116. The second optical component 308 is not solid at the stage shown in FIG. 8D and includes the second color-converting particles 310 having generally random orientations and suspended at generally random positions within the second matrix 312. As shown in FIG. 8E, the magnet 154 is positioned near the SSRT device 300 at a different angle and magnetic orientation than shown in FIG. 8C. The proximity of the magnet 154 to the SSRT device 300 causes a generally H-type magnetic field represented by magnetic field lines 156 to extend through the second matrix 312, which causes the second color-converting particles 310 to become generally non-randomly magnetically and shape aligned. The magnet 154 is then removed and the second matrix 312 is partially or completely solidified, e.g., partially or completely solidified alone or in combination with the first matrix 306.

Figure 8F:
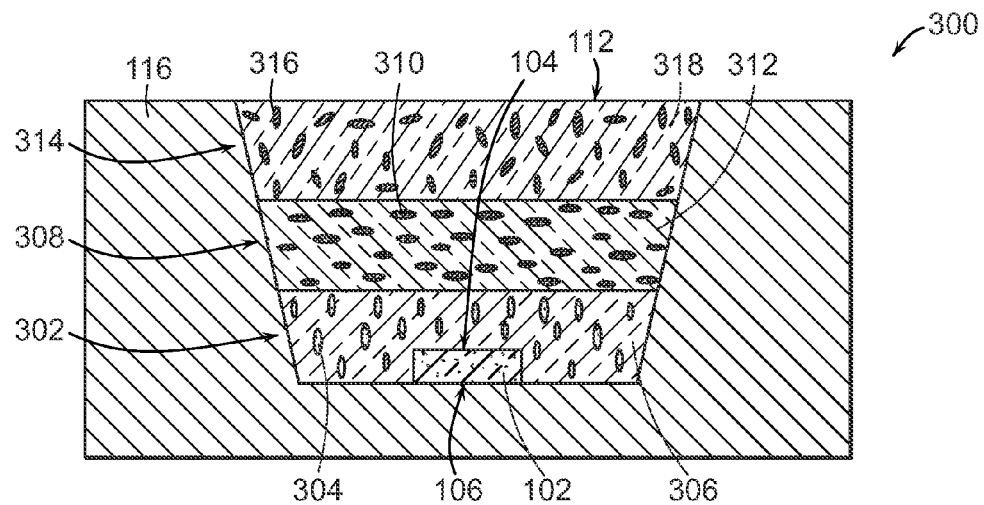
Figure 8G:
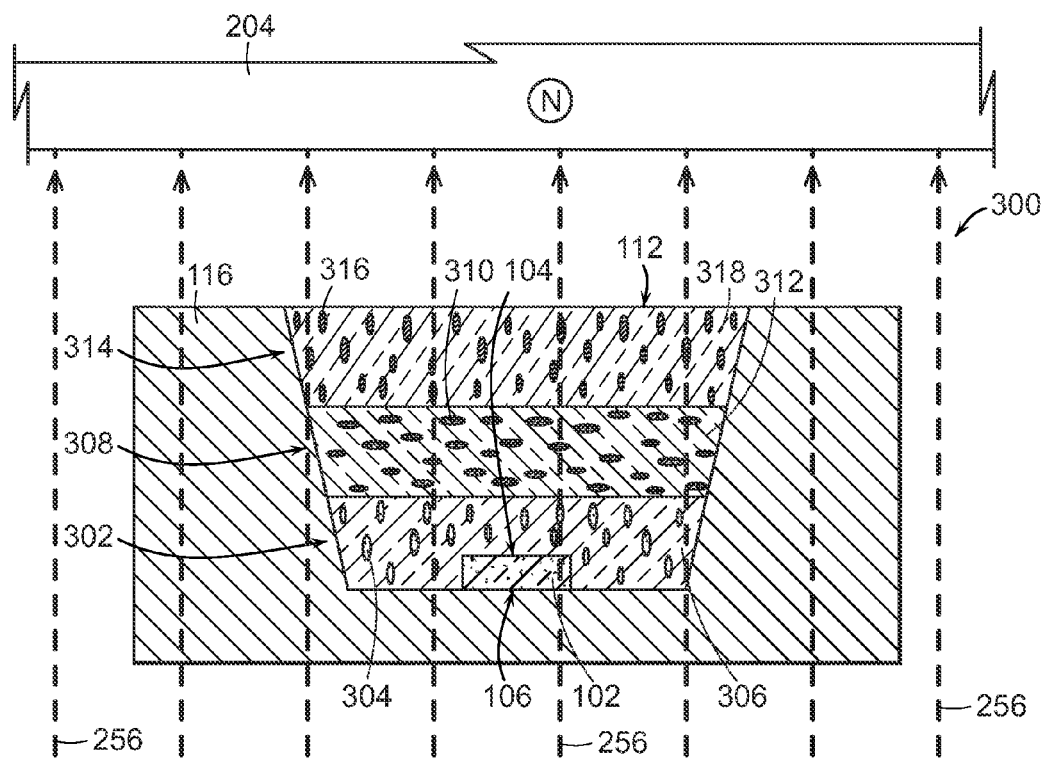

FIG. 8F illustrates a step in the method after the third optical component 314 is deposited over the second optical component 308 within the trench of the heat sink 116. In combination, the first, second, and third optical components 302, 308, 314 fill generally the entire trench of the heat sink 116. The third optical component 314 is not solid at the stage shown in FIG. 8F and includes the third color-converting particles 316 having generally random orientations and suspended at generally random positions within the third matrix 318. As shown in FIG. 8G, the magnet 154 is positioned near the SSRT device 300 at the same angle and magnetic orientation shown in FIG. 8C. The proximity of the magnet 154 to the SSRT device 300 causes a generally B-type magnetic field represented by magnetic field lines 258 to extend through the third matrix 318 of the third optical component 314, which causes the third color-converting particles 316 to become generally non-randomly magnetically and shape aligned. The magnet 154 is then removed and the first, second, and third matrices 306, 312, 318 can be fully solidified. In other embodiments of the present technology, the third matrix 318 can partially solidified and then fully solidified along with the first and second matrices 306, 312 in a separate step. In some embodiments, magnetic adjustment occurs during or after partial solidification. Furthermore, partial solidification of one or more components can allow for supplemental magnetic adjustment (e.g., fine tuning) prior to full solidification. For example, a supplemental magnetic adjustment can be performed on the first, second, and third optical components 302, 308, 314 prior fully solidifying the first, second, and third optical components. Supplemental magnetic adjustment and/or full solidification can be performed, for example, on the first, second, and third optical components 302, 308, 314 collectively. As discussed in greater detail below, initial, supplemental, and other magnetic adjustment can occur in conjunction with collecting performance data.

A magnet used to adjust the orientation or position of color-converting particles in embodiments of the present technology can be any of a suitable variety of magnetic field sources. For example, the magnet can be a permanent magnet, a temporary magnet, or an electromagnet. As shown in FIGS. 3C, 6C, 6D, 8C, 8E, and 8G the magnet can be adjustable with respect to position (e.g., angle or distance from a target) and/or magnetic orientation. Similarly, an optical component or a support structure for an optical component can be adjustable relative to a stationary or adjustable magnet. A magnetic field applied to an optical component including color-converting particles can be adjustable with respect to type (e.g., H and/or B), direction, shape, position (e.g., angle), and/or strength. In FIGS. 3C and 8E, the magnetic field lines 156 are representative of a generally H-type magnetic field extending at angles of about 30° and about 0°, respectively, relative to the active side 104 of the SSRT 102. In FIGS. 6C, 6D, 8C, and 8G, the magnetic field lines 256 are representative of a generally B-type magnetic field extending at an angle of about 90° relative to the active side 104 of the SSRT 102. The magnetic field lines 154, 256 shown in FIGS. 3C, 6C, 6D, 8C, 8E, and 8G are generally straight and parallel, which can indicate that the magnet 154 is significantly larger than the SSRT devices 150, 250, 300. In other embodiments of the present technology, a magnetic field with magnetic field lines that are curved or non-parallel can be used to adjust the position or orientation of color-converting particles.

Moving a magnet relative to an optical component and/or moving the optical component relative to the magnet can change the magnetic field type, direction, shape, position, and/or strength within the optical component. After magnetically adjusting their positions or orientations, color-converting particles of the optical component can have generally non-random magnetic and/or shape alignments corresponding partially or fully to any suitable combination of these properties of an applied magnetic field. In embodiments of the present technology, a generally H-type magnetic field can be used to adjust the orientation of elongated color-converting particles so that their lengths have an angle from about 0° to about 45° relative to an active side of an associated SSRT. Similarly, in embodiments of the present technology, a generally B-type magnetic field can be used to adjust the orientation of elongated color-converting particles so that their lengths have an angle from about 45° to about 90° relative to an active side of an associated SSRT. Although not necessary, these uses of generally H-type and generally B-type magnetic fields can facilitate symmetry in the orientations of color-converting particles with an axis of symmetry generally perpendicular to an active side of an associated SSRT.

Adjusting the position or orientation of color-converting particles within an optical component can improve the reliability of the optical component in addition to or instead of changing the performance characteristics of the optical component. For example, some color-converting materials are susceptible to degradation at high temperatures. Adjusting the positions of color-converting particles including color-converting materials susceptible to degradation at high temperatures to be further from a heat-generating component (e.g., an SSRT) can reduce the operating temperatures of the color-converting particles and, correspondingly, increase the reliability and longevity of the color-converting particles. In embodiments of the present technology, color-converting particles can be repositioned to be more densely packed within a portion (e.g., a layer) of a matrix. For example, color-converting particles can have an average distance from an SSRT after a magnetic-adjustment process that is greater than their average distance from the SSRT prior to the magnetic-adjustment process.

The viscosity of a matrix in its non-solid form (e.g., in its uncured form) and/or the strength of an applied magnetic field can affect whether color-converting particles are reoriented within the matrix (as shown in FIG. 3C) or both reoriented and repositioned within the matrix (as shown in FIGS. 6C-6D). These factors also can affect the fraction of color-converting particles reoriented or repositioned as well as the degree of reorientation or repositioning. In embodiments of the present technology, the viscosity of a matrix can be adjusted in combination with applying a magnetic field to cause a desired level of adjustment of the orientation or position of color-converting particles within the matrix. Adjusting the viscosity of a matrix can include partially solidifying the matrix, such as heating or irradiating the matrix to partially cure the matrix. After a magnetic-adjustment process, the matrix can be fully solidified while the magnetic field is still in place or after the magnetic field has been removed. For example, the viscosity of the matrix can be sufficiently high that the matrix holds the color-converting particles in their adjusted orientations or positions at least temporarily without a magnetic field. This can provide, for example, enough time to move the matrix into a separate tool configured to solidify the matrix.

All or generally all of the color-converting particles 114 within the optical components 152, 252 are reoriented into generally non-random magnetic and shape alignments in the magnetic-adjustment processes shown in FIGS. 3C, 6C, and 6D. Similarly, all or generally all of the first, second, and third color-converting particles 304, 308, 316 within the first, second, and third optical components 302, 308, and 314, respectively, are reoriented into generally non-random magnetic and shape alignments in the magnetic-adjustment processes shown in FIGS. 8C, 8E, and 8G. In other embodiments of the present technology, only some, most, or generally all of the color-converting particles within an optical component can be reoriented into generally non-random magnetic and/or shape alignments. For example, color-converting particles closer to a magnet during a magnetic-adjustment process can be reoriented into generally non-random magnetic and/or shape alignments and color-converting particles further from the magnet during the magnetic-adjustment process can remain generally randomly oriented. Magnetic fields typically diminish about exponentially relative to distance from a target. Accordingly, in some embodiments, a magnet and an optical component are spaced apart such that a threshold distance above which a magnetic field has a strength corresponding to a first amount of magnetic and/or shape alignment of color-converting particles within a matrix of the optical component and below which the magnetic field has a strength corresponding to a second amount of magnetic and/or shape alignment can be located at an intermediate position within the matrix. Furthermore, color-converting particles can be reoriented into full generally non-random magnetic and/or shape alignments or partial generally non-random magnetic and/or shape alignments. For example, a magnetic field can be applied to cause a reorientation force that only slightly exceeds a force necessary to reorient all or a portion of color-converting particles within a matrix in its non-solid form to become generally non-randomly magnetically and/or shape aligned. This magnetic field can be removed before the color-converting particles reorient themselves into full generally non-random magnetic and/or shape alignments so as to leave the color-converting particles in partial generally non-random magnetic and/or shape alignments.

The color-converting particles 114, 202, 204, 304, 308, 316 of FIGS. 1, 2, 3B-5, 6B-7, and 8B-8G are all shown as generally prolate spheroids. Color-converting particles of optical components configured in accordance with embodiments of the present technology can be generally prolate spheroids, generally oblate spheroids, generally cylinders, generally cuboids, or can have other regular shapes or irregular shapes. In embodiments of the present technology, some, most, generally all, or all color-converting particles within a matrix can be generally non-spherical. Similarly, some, most, generally all, or all color-converting particles within a matrix can be generally elongated. It is expected that adjusting the orientation of generally non-spherical or generally elongated color-converting particles can have a greater effect on the amount of color conversion within a device than adjusting the orientation of generally spherical or generally non-elongated color-converting particles. In embodiments of the present technology, the color-converting particles within a matrix can have an average aspect ratio from about 1.1 to about 50, e.g., from about 1.5 to about 20 or from about 2 to about 10. Color-converting particles of optical components configured in accordance with embodiments of the present technology can have a variety of suitable sizes. For example, color-converting particles can have average effective diameters of from about 1 micron to about 200 microns, e.g., from about 2 microns to about 100 microns or from about 4 microns to about 50 microns.

Color-converting particles in embodiments of the present technology can be magnetically anisotropic. For example, some, most, generally all, or all color-converting particles within a matrix can be prone to reorientation (e.g., rotation) in response to an applied magnetic field. The correlation between the shape of a color-converting particle and its magnetic anisotropy can be generally non-random or generally random among color-converting particles in embodiments of the present technology. For example, the correlations between the shapes of the color-converting particles 114, 202, 204, 304, 308, 316 of FIGS. 1, 2, 3B-5, 6B-7, and 8B-8G and their magnetic anisotropies are generally non-random. The color-converting particles 114, 202, 204, 304, 308, 316 of FIGS. 1, 2, 3B-5, 6B-7, and 8B-8G are all elongated and prone to reorientation with their long axes generally parallel to a magnetic field. In other embodiments of the present technology, some, most, generally all, or all color-converting particles within a matrix can be magnetic anisotropic with a different generally non-random or generally random correlation between the shapes of the color-converting particles and their magnetic anisotropies. For example, generally random positioning of magnetic and non-magnetic materials in color-converting particles can cause a generally random correlation between the shapes of the color-converting particles and their magnetic anisotropies. An applied magnetic field can cause such color-converting particles to reorient into a generally non-random magnetic alignment that is generally random with regard to the shapes of the color-converting particles.

It is expected that the combination of generally non-random magnetic alignment and generally non-random shape alignment of color-converting particles will allow for greater control over performance characteristics than generally non-random magnetic alignment without generally non-random shape alignment of the color-converting particles. Magnetically adjusting color-converting particles without causing generally non-random shape alignment of the color-converting particles can be useful, however, in some circumstances. For example, different configurations of generally random shape orientations of color-converting particles can correspond to different performance characteristics. Switching between these different configurations of generally random shape orientations of color-converting particles give devices multiple opportunities to qualify for desirable binning. For example, an optical component including color-converting particles with a first configuration of generally random shape orientations can have different performance characteristics than the same optical component including the same color-converting particles with a second, different configuration of generally random shape orientations. If the first configuration does not correspond to desired performance characteristics, a magnetic-adjustment process according to embodiments of the present technology can be used to cause the color-converting particles to reorient into the second configuration, which may or may not have the desired performance characteristics.

Color-converting particles configured in accordance with embodiments of the present technology can be configured with or selected to have certain shapes or magnetic properties useful for a magnetic-adjustment process. For example, particles of a magnetic material can be combined with particles of a color-converting material to form magnetically anisotropic color-converting particles. Positioning the magnetic material in a shape-dependent manner (e.g., consistently near the ends of elongated particles of the color-converting material) can cause a generally non-random correlation between the shapes of the resulting color-converting particles and their magnetic anisotropies. As discussed above, color-converting particles that are generally non-spherical or generally elongated can be preferable in embodiments of the present technology to color-converting particles that are generally spherical or generally non-elongated. Conventional controlled assembly techniques (e.g., sol-gel techniques) can be used to form color-converting particles having desirable shapes or magnetic properties useful for a magnetic-adjustment process.

Figure 9:
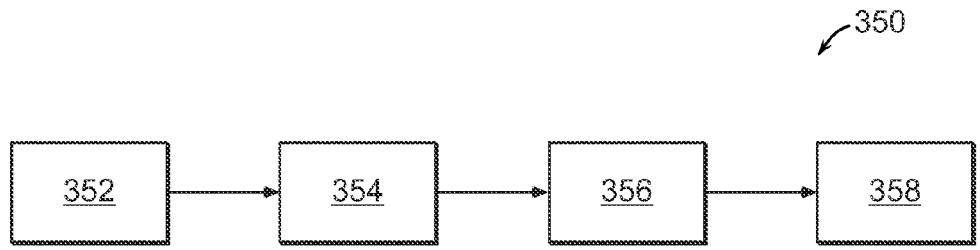
FIG. 9 is a block diagram of a system configured in accordance with an embodiment of the present technology and related to magnetically adjusting color-converting materials within a matrix.

Magnetically adjusting color-converting particles within a matrix of an optical component of a device (e.g., an SSRT device) can be performed as a routine step in a manufacturing process. For example, devices can be subjected to a magnetic-adjustment process prior to final testing and/or product binning FIG. 9 is a block diagram of an example of a system 350 configured in accordance with an embodiment of the present technology including a magnetic-adjustment station 352, a matrix-solidification station 354, a testing station 356, and a product bin 358. Devices from a manufacturing process can be delivered to the magnetic-adjustment station 352 where the devices can be subjected to a magnetic-adjustment process. For example, if it is useful to increase (e.g., maximize) the ratio of converted light to total light exiting the devices, a corresponding magnetic-adjustment process can be performed on the devices. After the magnetic-adjustment process, the devices can be transferred to the matrix-solidification station 354 where the matrices of the devices can be solidified. The devices then can be transferred to the testing station 356. Based on test results from the testing station 356, devices meeting specified performance characteristics can be transferred to the product bin 358.

Figure 10:
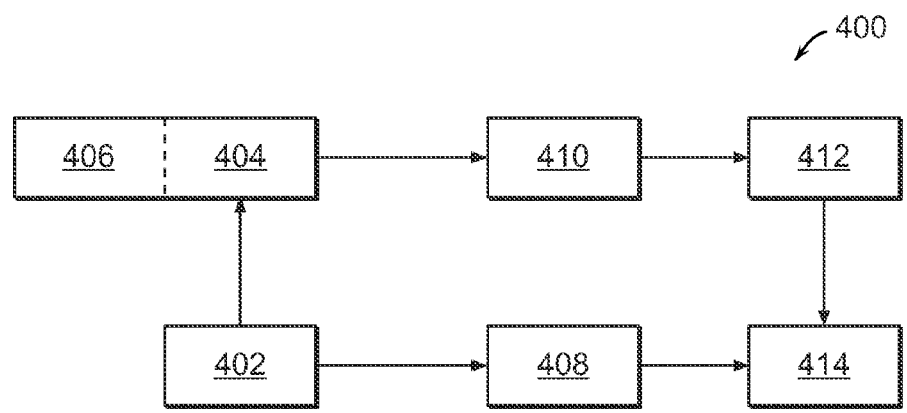
FIG. 10 is a block diagram of a system configured in accordance with an embodiment of the present technology and related to magnetically adjusting color-converting materials within a matrix in conjunction with device testing.

In embodiments of the present technology, magnetically adjusting color-converting particles within a matrix of an optical component of a device can be performed after testing the device. In these and/or other embodiments of the present technology, test results can influence whether a magnetic-adjustment process is necessary for a device and/or the parameters of a magnetic-adjustment process likely to improve the performance characteristics of the device. FIG. 10 is a block diagram of a system 400 configured in accordance with an embodiment of the present technology including a first testing station 402, a magnetic-adjustment station 404, a processor 406, a first matrix-solidification station 408, a second matrix-solidification station 410, a second testing station 412, and a product bin 414. Devices having color-converting particles in a non-solid matrix can be tested for performance characteristics (e.g., CCT or lumen output) at the testing station 402. Based on the test results, devices meeting specified performance characteristics can be transferred to the first matrix-solidification station 408, where the non-solid matrices of the devices can be solidified. The devices meeting the specified performance characteristics then can be transferred to the product bin 414. The remaining devices as well as data corresponding to test results for the remaining devices can be transferred from the testing station 402 to the magnetic-adjustment station 404. The processor 406 can be in communication with the magnetic-adjustment station 404 and can convert the data corresponding to the test results for the remaining devices into signals instructing the magnetic-adjustment station 404 to perform certain magnetic-adjustment processes on the remaining devices. For example, if one of the remaining devices has a lumen output lower than a specified range, the processor 406 can generate a signal instructing the magnetic-adjustment station 404 to perform a magnetic-adjustment process designed to increase the lumen output of the device. The parameters of a magnetic-adjustment process can include, for example, type, direction, shape, position, strength, and/or duration of an applied magnetic field. Correlations between these parameters and changes in performance characteristics can be developed empirically. After a magnetic-adjustment process, the remaining devices can be transferred to the second matrix-solidification station 410 where the matrices of the devices can be solidified. The devices then can be transferred to the second testing station 412. Based on test results from the second testing station 412, devices meeting specified performance characteristics can be transferred to the product bin 414.

Figure 11:
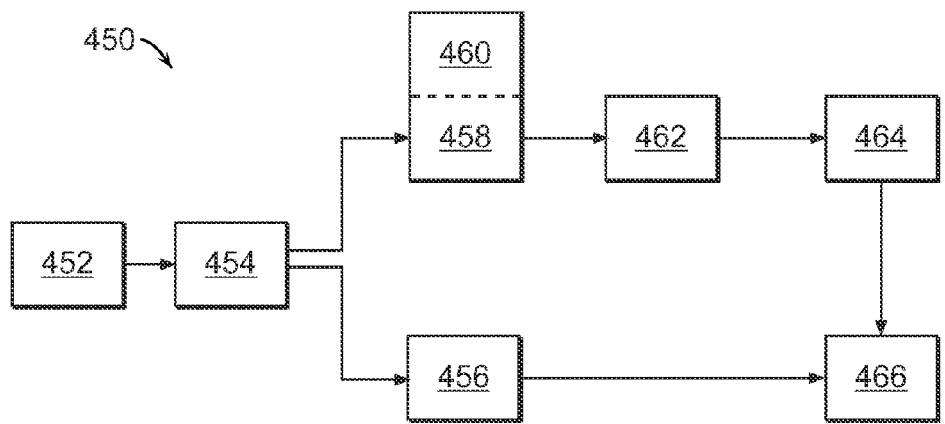
FIG. 11 is a block diagram of a system configured in accordance with an embodiment of the present technology and related to magnetically adjusting color-converting materials within a matrix in conjunction with light-source testing.

Data from testing a light source prior to packaging can influence a magnetic-adjustment process in embodiments of the present technology. FIG. 11 is a block diagram of a system 450 configured in accordance with an embodiment of the present technology including a light-source-testing station 452, a packaging-assembly station 454, a first device-testing station 456, a magnetic-adjustment station 458, a processor 460, a matrix-solidification station 462, a second device-testing station 464, and a product bin 466. Light sources (e.g. SSRTs) can be tested for performance characteristics (e.g., CCT or lumen output) at the light-source-testing station 452. Based on the test results from the light-source-testing station 452, light sources likely to meet specified device-level performance characteristics can be assembled at the packaging-assembly station 454. Devices including the light sources then can be transferred to the first device-testing station 456, where the devices can be tested for the device-level performance characteristics. Devices meeting the specified device-level performance characteristics then can be transferred to the product bin 466. The remaining light sources also can be assembled at the packaging-assembly station 454. Devices including the remaining light sources can be transferred to the magnetic-adjustment station 458. Data corresponding to test results for the remaining light sources from the light-source-testing station 452 can be transferred with the remaining light sources through the packaging-assembly station 454 and to the magnetic-adjustment station 458. The processor 460 can be in communication with the magnetic-adjustment station 458 and can convert the data corresponding to the test results for the remaining light sources into signals instructing the magnetic-adjustment station 458 to perform certain magnetic-adjustment processes on the devices including the remaining light sources. After a magnetic-adjustment process, the devices can be transferred to the matrix-solidification station 462 where the matrices of the devices can be solidified. The devices then can be transferred to the second device-testing station 464, where the devices can be tested for the device-level performance characteristics. Devices meeting the specified device-level performance characteristics then can be transferred to the product bin 466.

Figure 12:
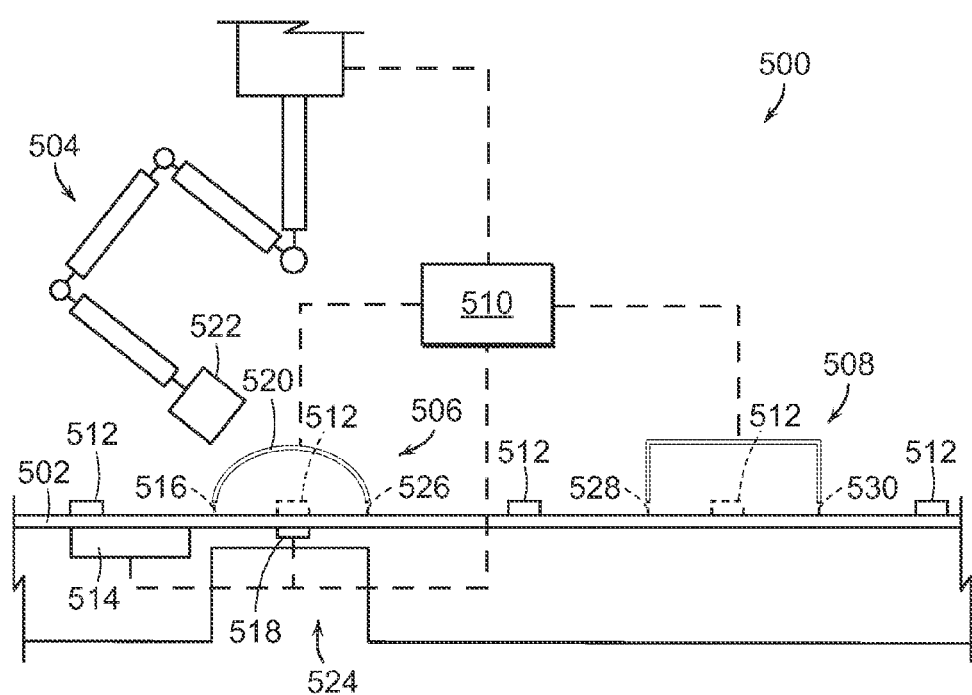
FIG. 12 is a partially schematic diagram of a system configured in accordance with an embodiment of the present technology and related to magnetically adjusting color-converting materials within a matrix in conjunction with simultaneous or closely-sequential device testing.

In embodiments of the present technology a magnetic-adjustment process can be performed in conjunction with device testing. For example, a magnetic-adjustment process and device testing can be performed simultaneously or in close sequential relationship. FIG. 12 illustrates a system 500 configured in accordance with an embodiment of the present technology capable of simultaneously performing device testing and a magnetic-adjustment process. The system 500 includes a conveyor 502, a robotic arm 504, a light-output tester 506, a matrix-solidifying oven 508, and a processor 510. Devices 512 from a manufacturing process enter the system 500 on the conveyor 502. A conveyor controller 514 instructs the conveyor 502 to advance the devices 514 with appropriate delays for processing steps. Upon entering the system 500, the devices 512 include color-converting particles (not shown) in a non-solid matrix (not shown). Each device 512 moves left-to-right in FIG. 12, first entering the light-output tester 506 through a light-output tester entrance 516. Within the light-output tester 506, a probe 518 activates the device 512 causing the device to emit light to a collection dome 520. Data related to the emitted light are then sent to the processor 510. Based on the data, the processor 510 sends a signal to the robotic arm 504 to move a magnet 522 to a different position relative to the device 512 and thereby cause magnetic adjustment of the color-converting particles within the device. For example, if the device 512 has a lumen output lower than a specified range, the processor 510 can generate a signal instructing the robotic arm 504 to perform a magnetic-adjustment process designed to increase the lumen output of the device. An opening 524 below the light-output tester 506 can allow the robotic arm 504 to position the magnet 522 below the device to perform certain magnetic-adjustment processes (e.g., the magnetic-adjustment process shown in FIG. 6D). In embodiments of the present technology, the robotic arm 504 can be replaced with another positioning device, such as a gimbal. The positioning device can be configured to move the magnet 522 to positions having any suitable distance (e.g., from about 1 mm to about 500 cm) from a portion of the conveyor configured to support the device 512 during a magnetic-adjustment process.

During or after a magnetic-adjustment process, the light-output tester 506 can collect data that can be used to control the parameters of the magnetic-adjustment process or parameters of subsequent magnetic-adjustment processes. For example, the device 512 can be activated during a magnetic-adjustment process and the magnetic-adjustment process can cause a change in a performance characteristic of the device that the light-output tester 506 reports in real time or near real time. The changing performance characteristic can influence the parameters of the simultaneous magnetic-adjustment process. For example, the processor 510 can send a signal to the robotic arm 504 to stop a magnetic-adjustment process as soon as light-output data collected during the magnetic-adjustment process indicates that a performance characteristic of a device is within a specified range. Upon completing a magnetic-adjustment process, such as after a device 512 reaches a threshold value of a performance characteristic, the conveyor 502 can advance the device out of the light-output tester 506 through a light-output tester exit 526 and into the matrix-solidifying oven 508 through a matrix-solidifying oven entrance 528. Within the matrix-solidifying oven 508, the device 512 can be subjected to heat energy (e.g., from a resistive heater, an infrared heater, or a microwave heater) to solidify the matrix around the color-converting particles of the device. Once the solidification is complete, the device 512 can exit the matrix-solidifying oven 508 through a matrix-solidifying oven exit 530.

Figure 13:
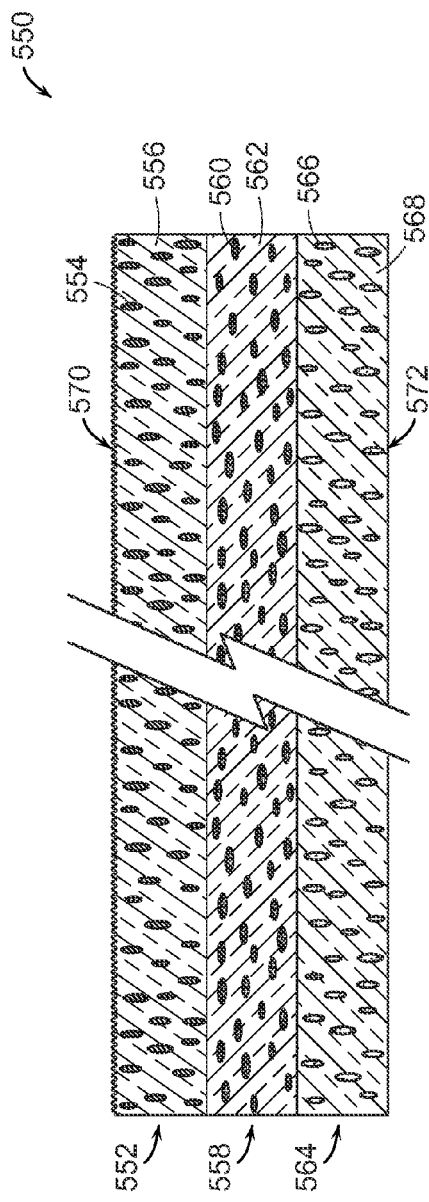
FIG. 13 is a partially schematic cross-sectional diagram of a transmissive support assembly configured in accordance with an embodiment of the present technology and having three optical components individually having a different type of color-converting particle.

Magnetic adjustment according to embodiments of the present technology can be performed on devices including SSRTs or other devices, such as optical components intended for incorporation into devices including SSRTs. For example, FIG. 13 illustrates a transmissive support assembly 550 including a first optical component 552 having first color-converting particles 554 within a first matrix 556, a second optical component 558 having second color-converting particles 560 within a second matrix 562, and a third optical component 564 having third color-converting particles 566 within a third matrix 568. The first color-converting particles 554, the second color-converting particles 560, and the third color-converting particles 566 can be magnetically aligned within the first matrix 556, the second matrix 562, and the third matrix 568 similarly to the first, second, and third color-converting particles 304, 310, 316 shown in FIG. 7. The transmissive support assembly 550 also has a textured first side 570 (e.g., to reduce total internal reflection) and a back side 572. In an alternative embodiment, the first side 570 is not textured.

Figure 14:
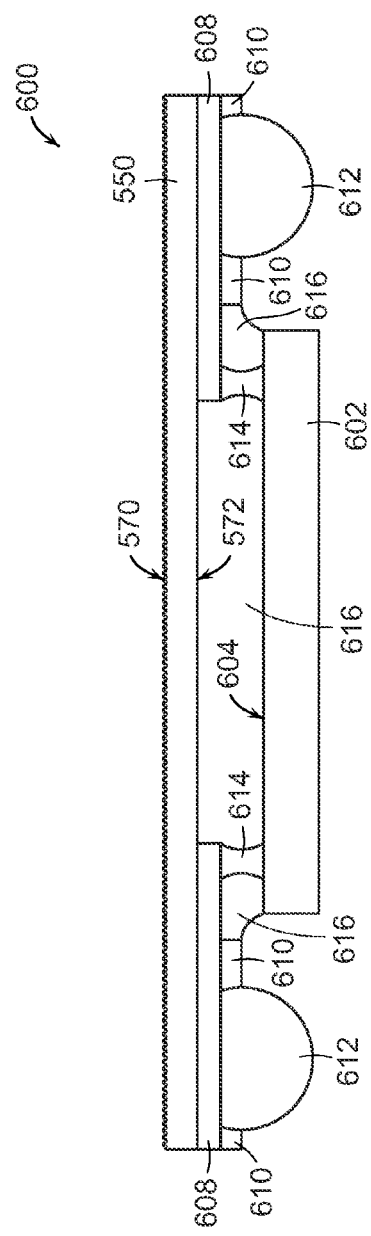
FIG. 14 is a partially schematic cross-sectional diagram of an SSRT device configured in accordance with an embodiment of the present technology and including the transmissive support assembly shown in FIG. 13.

FIG. 14 illustrates an SSRT device 600 including the transmissive support assembly 550 shown in FIG. 13 and a radiation transducer 602 with an active side 604. The radiation transducer 602 is flip-chip mounted onto the back side 572. For clarity of illustration, internal structures of the transmissive support assembly 550 are not shown in FIG. 14. The SSRT device 600 further includes leads 608 (e.g., patterned leads) on the back side 572, a solder mask 610 on the leads 608, and external solder bumps 612 electrically connected to the leads 608 and partially isolated within openings of the solder mask 610. The SSRT device 600 also includes solder connections 614 electrically connecting contacts (not shown) on the active side 604 to the leads 608, and underfill 616 extending around the solder connections 614 and between the active side 604 and the back side 572. In addition to the transmissive support assembly 550, other optical components that can include magnetically-aligned color-converting particles configured in accordance with embodiments of the present technology are shown in U.S. patent application Ser. No. 13/219,530, which is incorporated herein by reference.

Embodiments of the present technology can include variations of the systems 350, 400, 450, 500 shown in FIGS. 9-12. For example, in some embodiments of the present technology, the system 400 shown in FIG. 10 does not include a processor 406 and is not configured to process devices differently according to different test results from the first testing station 402. Instead, the magnetic-adjustment station 404 can be configured to perform a single type of magnetic-adjustment process on all devices from the first testing station 402 not meeting specified performance characteristics. Multiple magnetic-adjustment stations can be included in the system 400, each configured to perform a different type of magnetic-adjustment process. Devices can be routed to the different magnetic-adjustment stations according to the test results from the first testing station 402. For example, devices having CCTs lower than a specified range can be transferred to a magnetic-adjustment station configured to perform a magnetic-adjustment process designed to increase the CCT of a device, while devices having CCTs higher than a specified range can be transferred to a magnetic-adjustment station configured to perform a magnetic-adjustment process designed to decrease the CCT of a device. In addition to or instead of moving the magnet 522 shown in FIG. 12 relative to the device 512, the device can be moved relative to the magnet. For example, the magnet 522 can be stationary and the device 512 can be moved relative to the magnet on an end of the robotic arm 504. The magnet 522 can be an electromagnetic that can be operated at a higher or lower current to strengthen or weaken a magnetic field. In embodiments of the present technology, multiple magnets can be used at different positions relative to a device and selectively activated to perform a magnetic-adjustment process.

Elements shown in FIGS. 9-12 can be divided or combined in embodiments of the present technology. For example, the packaging-assembly station 454 shown in FIG. 11 can include multiple individual processing tools configured to perform packaging assembly and/or other functions. As another example, in the system 400 shown in FIG. 10, the first and second matrix-solidification stations 408, 410 can be combined and/or the first and second testing stations 402, 412 can be combined. Similarly, in the system 450 shown in FIG. 11, the first and second testing stations 456, 464 can be combined. In the system 500 shown in FIG. 12, the matrix-solidifying oven 508 can integrated with the light-output tester 506. This can allow a matrix to be solidified with little or no delay after a magnetic-adjustment process. For example, the matrix can be solidified while a magnetic field from the magnet 522 holds color-converting particles within the matrix in magnetically-adjusted positions or orientations. The systems 350, 400, 450 can be similarly modified to include matrix solidification concurrent with applying a magnetic field. For example, the magnetic-adjustment station 352 and the matrix-solidification station 354 can be combined in the system 350 shown in FIG. 9. This can include, for example, combining the magnetic-adjustment station 352 with a heat source (e.g., a resistive, infrared, or microwave heat source).

In embodiments of the present technology, the systems 350, 400, 450, 500 shown in FIGS. 9-12 or components thereof can be configured to process devices individually or in groups. For example, devices having a similar deficiency (e.g. devices all having a CCT lower than a specified range) can be grouped on a panel to be subjected to simultaneous magnetic-adjustment processes in the magnetic-adjustment station 404 shown in FIG. 10. After magnetic-adjustment processes, multiple devices can be grouped into batches for matrix solidification. For example, in the system 500 shown in FIG. 12, devices 512 exiting the light-output tester 506 can be grouped prior to processing in the matrix-solidifying oven 508.

The foregoing description provides many specific details for a thorough understanding of, and enabling description for, embodiments of the present technology. Well-known structures and systems as well as methods often associated with such structures and systems have not been shown or described in detail to avoid unnecessarily obscuring the description of the various embodiments of the disclosure. In addition, those of ordinary skill in the relevant art will understand that additional embodiments can be practiced without several of the details described herein.

Throughout this disclosure, the singular terms "a," "an," and "the" include plural referents unless the context clearly indicates otherwise. Similarly, the word "or" is intended to include "and" unless the context clearly indicates otherwise. Directional terms, such as "upper," "lower," "front," "back," "vertical," and "horizontal," may be used herein to express and clarify the relationship between various elements. It should be understood that such terms do not denote absolute orientation. Reference herein to "one embodiment," "an embodiment," or similar formulations, means that a particular feature, structure, operation, or characteristic described in connection with the embodiment is included in at least one embodiment of the present technology. Thus, the appearances of such phrases or formulations herein are not necessarily all referring to the same embodiment. Furthermore, various particular features, structures, operations, or characteristics may be combined in any suitable manner in one or more embodiments.

From the foregoing, it will be appreciated that specific embodiments of the present technology have been described herein for purposes of illustration, but that various modifications may be made without deviating from the technology. For example, in the SSRT device 100 shown in FIG. 1, the trench of the heat sink 116 can be filled with a non-color-converting optical component and the optical component 108 can be positioned over the non-color-converting optical component. Certain aspects of the present technology described in the context of particular embodiments can be combined or eliminated in other embodiments. For example, the third optical component 314 can be eliminated in the SSRT device 300 shown in FIG. 7. Furthermore, while advantages associated with certain embodiments of the present technology have been described in the context of those embodiments, other embodiments can also exhibit such advantages, and not all embodiments need necessarily exhibit such advantages to fall within the scope of the technology. Accordingly, the disclosure and associated technology can encompass other embodiments not expressly shown or described herein.

We claim:

1. A method, comprising:
    applying a first magnetic field to a first mixture that includes a first non-solid matrix and color-converting particles within the first matrix, so that the color-converting particles within the first matrix move into a first non-random alignment within the first matrix, the first mixture forming a portion of a device;
    increasing a solidity of the first matrix after the color-converting particles within the first matrix move into the first non-random alignment;
    adding a second mixture to the device after increasing the solidity of the first matrix, the second mixture including a second non-solid matrix and color-converting particles within the second matrix; and
    applying a second magnetic field to the second mixture so that the color-converting particles within the second matrix move into a second non-random alignment within the second matrix.

2. The method of claim 1, wherein the color-converting particles within the first matrix are magnetically anisotropic.

3. The method of claim 2, wherein the color-converting particles within the first matrix have an average aspect ratio from about 2 to about 10.

4. The method of claim 2, wherein the first non-random alignment is a non-random shape alignment.

5. The method of claim 2, wherein the first non-random alignment is a non-random magnetic alignment.

6. The method of claim 2, wherein the color-converting particles within the first matrix include a transparent magnetic material.

7. The method of claim 2, wherein the color-converting particles within the first matrix include a color-converting material functionalized with a magnetic functional group.

8. The method of claim 2, wherein the first matrix is transparent.

9. The method of claim 1, wherein increasing the solidity of the first non-solid matrix includes solidifying the first non-solid matrix to form a solid matrix.

10. The method of claim 9, further comprising attaching the solid matrix to a solid-state radiation transducer such that the solid matrix is positioned along a radiation path along which radiation is emitted or received by the radiation transducer.

11. The method of claim 10, wherein the solid matrix is optically transparent.

12. The method of claim 10, wherein attaching the solid matrix to the radiation transducer includes flip-chip mounting the radiation transducer to the solid matrix.

13. The method of claim 10, wherein the radiation transducer is a light-emitting diode.

14. The method of claim 1, wherein increasing the solidity of the first non-solid matrix includes increasing the solidity of the first non-solid matrix while applying the first magnetic field.

15. The method of claim 1, further comprising combining the first mixture with a radiation transducer before applying the first magnetic field.

16. The method of claim 1, wherein the color-converting particles within the first matrix and the color-converting particles within the second matrix include different color-converting materials.

17. A method, comprising:
measuring an optical output of a solid-state radiation transducer ("SSRT") device that includes a non-solid matrix and color-converting particles within the non-solid matrix;
applying a magnetic field to the SSRT device to move the color-converting particles into a non-random alignment within the non-solid matrix and thereby change a proportion of optical paths through the non-solid matrix that the color-converting particles occupy; and
increasing a solidity of the non-solid matrix after the color-converting particles move into the non-random alignment.

18. The method of claim 17, wherein increasing the solidity of the non-solid matrix includes solidifying the non-solid matrix to form a solid matrix.

19. The method of claim 17, wherein the optical output of the SSRT device changes after the color-converting particles move into the non-random alignment.

20. The method of claim 17, wherein applying the magnetic field includes applying a H-type magnetic field to the SSRT device to increase color conversion by the color-converting particles.

21. The method of claim 17, wherein applying the magnetic field includes applying a B-type magnetic field to the SSRT device to decrease color conversion by the color-converting particles.

22. The method of claim 17, wherein the optical output of the SSRT device corresponds to a correlated color temperature of the SSRT device and the correlated color temperature of the SSRT device changes after the color-converting particles move into the non-random alignment.

23. The method of claim 17, further comprising controlling a position, direction, strength, and/or duration of the magnetic field based on the optical output.

24. The method of claim 17, wherein the color-converting particles are evenly distributed within the non-solid matrix before applying the magnetic field and the color-converting particles are clustered within a layer of the non-solid matrix after applying the magnetic field.

25. The method of claim 17, wherein measuring the optical output and applying the magnetic field are at least partially concurrent.

26. The method of claim 25, wherein the optical output corresponds to a performance characteristic of the SSRT device, applying the magnetic field causes the performance characteristic to change, and applying the magnetic field includes applying the magnetic field until the performance characteristic reaches a threshold value.

27. A method, comprising:
applying a magnetic field to a mixture that includes a non-solid matrix and color-converting particles within the non-solid matrix, so that the color-converting particles move into a non-random alignment within the non-solid matrix, the mixture forming a portion of a solid-state radiation transducer ("SSRT") device; and
increasing a solidity of the non-solid matrix after the color-converting particles move into the non-random alignment,
wherein
the color-converting particles have a first average distance from an SSRT of the SSRT device before applying the magnetic field,
color-converting particles have a second average distance from the SSRT of the SSRT device after applying the magnetic field, and
the first average distance is less than the second average distance.

28. A method, comprising:
applying a magnetic field to an optical component that includes a non-solid matrix and color-converting particles within the non-solid matrix, wherein applying the magnetic field causes the color-converting particles to move into a non-random alignment within the non-solid matrix and thereby changes a proportion of optical paths through the optical component that the color-converting particles occupy; and
increasing a solidity of the non-solid matrix after the color-converting particles move into the non-random alignment.

29. The method of claim 28, wherein the color-converting particles are magnetically anisotropic.

30. The method of claim 28, wherein the color-converting particles have an average aspect ratio from about 2 to about 10.

31. The method of claim 28, wherein the non-random alignment is a non-random shape alignment.

32. The method of claim 28, wherein the non-random alignment is a non-random magnetic alignment.

33. The method of claim 28, wherein the color-converting particles include a transparent magnetic material.

34. The method of claim 28, wherein the color-converting particles include a color-converting material functionalized with a magnetic functional group.

35. The method of claim 28, further comprising measuring an optical output of an SSRT device including the optical component.

* * * * *

UNITED STATES PATENT AND TRADEMARK OFFICE
CERTIFICATE OF CORRECTION

| | | |
|---|---|---|
| PATENT NO. | : 9,039,474 B2 | Page 1 of 1 |
| APPLICATION NO. | : 13/294780 | |
| DATED | : May 26, 2015 | |
| INVENTOR(S) | : Sameer S. Vadhavkar et al. | |

It is certified that error appears in the above-identified patent and that said Letters Patent is hereby corrected as shown below:

Specification

In column 3, line 34, delete "decease," and insert -- decrease, --, therefor.

In column 13, line 31-32, delete "binning" and insert -- binning. --, therefor.

Claims

In column 20, line 25, in claim 27, delete "color-converting" and insert -- the color-converting --, therefor.

Signed and Sealed this
Ninth Day of February, 2016

Michelle K. Lee
*Director of the United States Patent and Trademark Office*